United States Patent
Hsu et al.

[11] Patent Number: 6,143,645
[45] Date of Patent: *Nov. 7, 2000

[54] REDUCED TEMPERATURE CONTACT/VIA FILLING

[75] Inventors: Wei-Yung Hsu; Qi-Zhong Hong, both of Dallas, Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 09/016,118

[22] Filed: Jan. 30, 1998

Related U.S. Application Data

[60] Provisional application No. 60/037,123, Feb. 3, 1997.

[51] Int. Cl.$^7$ ................................................. H01L 21/4763
[52] U.S. Cl. .......................... 438/627; 438/632; 438/644; 438/688
[58] Field of Search ..................................... 438/632, 646, 438/654, 644, 687, 688, 627, 643, 653

[56] References Cited

U.S. PATENT DOCUMENTS

| | | | |
|---|---|---|---|
| 5,534,463 | 7/1996 | Lee et al. | 438/656 |
| 5,877,087 | 3/1999 | Mosely et al. | 438/656 |
| 5,998,296 | 12/1999 | Saran et al. | 438/685 |

OTHER PUBLICATIONS

Dixit, G., et al., "A Novel High Pressure Low Temperature Aluminum Plug Technology . . . ," IEEE IEDM Tech. Digest, Dec. 1994, pp. 105–108.

*Primary Examiner*—T. N. Quach
*Attorney, Agent, or Firm*—Mark A. Valetti; Wade James Brady III; Frederick J. Telecky, Jr.

[57] ABSTRACT

An integrated circuit fabrication method for filling a high-aspect-ratio via with a metallization layer wherein there is provided a dielectric layer having a via therein. A wetting layer is deposited over the dielectric layer and within the via and the via sidewalls, the wetting layer being of a material which lowers the melting temperature of the metallization when combined with the metallization. The metallization layer is deposited over the wetting layer and the via but not completely filling the via with the metallization. The wetting agent with metallization thereon are heated to a temperature below the melting temperature of the metallization, the temperature being sufficient to cause the wetting layer to combine with the metallization, lower the melting temperature of the metallization to the temperature or below the heating temperature to cause the metallization to flow and fill the via. A diffusion barrier layer can be provided on the wetting layer over horizontal portions of the dielectric layer, but not on the wetting layer at sidewalls of the via.

12 Claims, 2 Drawing Sheets

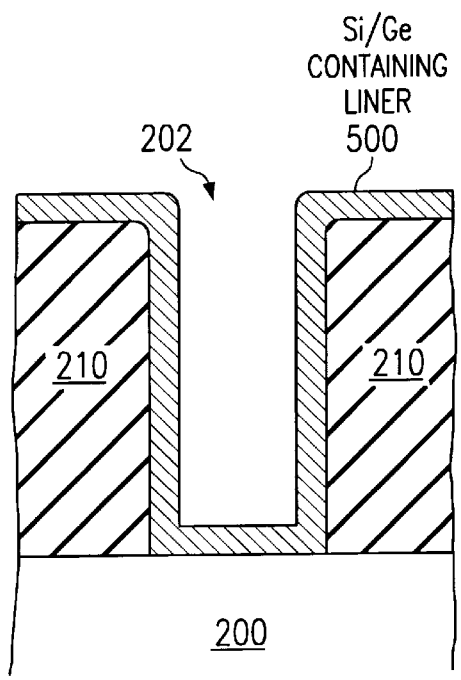
FIG. 2A
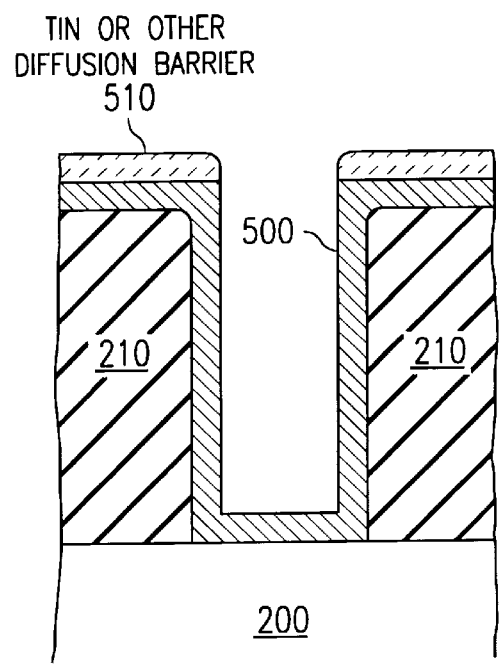
FIG. 2B
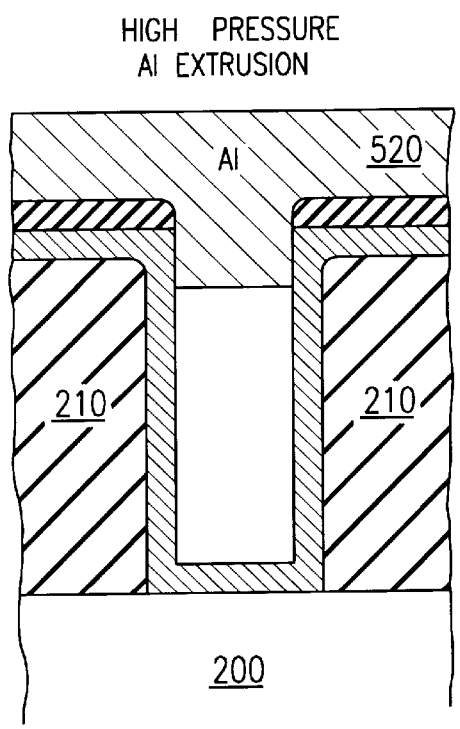
FIG. 2C1
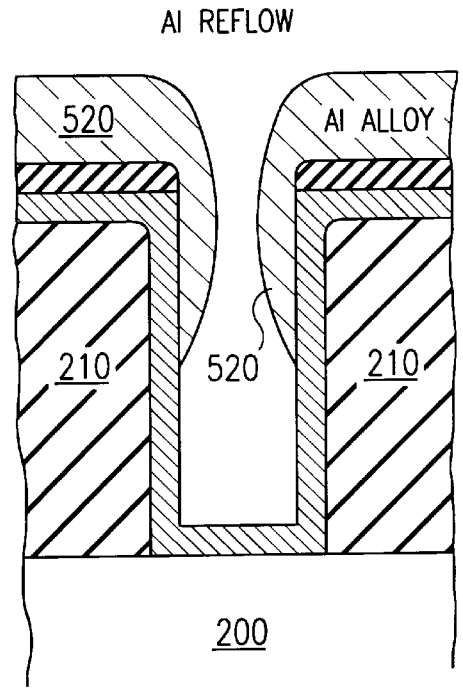
FIG. 2C2

REDUCED TEMPERATURE CONTACT/VIA FILLING

This is a Non Provisional application filed under 35 USC 119(e) and claims priority of prior provisional, Serial No. 60/037,123 of inventor Hsu, et al., filed Feb. 3, 1997.

BACKGROUND AND SUMMARY OF THE INVENTION

The present invention relates to integrated circuit metallization structures and methods.

Background: Aspect Ratio

In modern integrated circuit fabrication, it is increasingly necessary to fill vias and contact holes which have a high "aspect ratio". This means a ratio of height to width which is 2:1 or more, and, as technology progresses, may be as high as 10:1 or more in future generations. Completely filling such holes with metal at an acceptably low temperature is very difficult, particularly for metals (such as aluminum) which do not have a good low-temperature CVD process.

Currently there are two types of processes which appear attractive for filling such holes: reflow methods and extrusion cavity filling methods. Reflow methods apply a high temperature to help newly-arrived atoms to move around on the metal surface; extrusion cavity filling methods (like the "ForceFill" (™) process) apply physical pressure to force a soft layer of as-deposited material into the hole. However, both of these processes require high temperatures, which are incompatible with many materials, such as organics, polymers, and low-temperature dielectrics.

Background: Aluminum Metallization

One of the best characterized metallization systems for integrated circuits is aluminum. The interrelations of aluminum, silicon, and silicon oxides have been very extensively studied and characterized, and a huge wealth of practical experience has been accumulated, over the last 30 years, in dealing with this material system. Thus, while there has been much discussion recently of using alternative metallization systems, such as tungsten or copper, the aluminum metallization system is still extremely attractive.

For aluminum reflow to be compatible with low dielectric constant materials, the reflow temperature must be less than 450 degrees C. Furthermore, reflow processes normally require a good diffusion barrier for aluminum to be used at contact level; but the use of diffusion barriers will add to the metal stack height, thus increasing the line-to-line capacitance and the contact resistance. Furthermore, the speed of the chip will be reduced as well as the effective contact size.

Temperature constraints during metallization processing are important. For example, high temperatures (above 450 degrees C.) are incompatible with the low-permittivity materials which are desired for use in modern processes. Many of these materials are organic, and cannot withstand very high temperatures.

One constraint on aluminum metallization is imposed by the phenomenon of junction spiking. When pure aluminum is heated (even below its melting point) it can dissolve silicon which is in contact with it. Thus if pure aluminum meets monocrystalline silicon at a contact hole, the aluminum may grow dendritically into the silicon during thermal cycling. Such aluminum growths can penetrate junctions in the silicon, and thus destroy the desired electronic device. The conventional solution to this problem is to use aluminum metallization which is alloyed with a small fraction of silicon, e.g. 1% atomic. This fraction of silicon reduces the aluminum's tendency to dissolve silicon. However, the use of silicon alloys brings in some further problems.

Another constraint in the aluminum-silicon system is posed by precipitation. Thermal cycling of silicon-alloyed aluminum can result in the formation of monocrystalline silicon precipitates within the aluminum, or at the interface from the aluminum to the silicon or to the diffusion barrier. Such precipitates may be difficult to clear during the aluminum etching and/or may degrade the net resistance of the contact.

Another concern with aluminum metallization is electromigration: a pure aluminum line may gradually thin out, in service, in locations of high current density. However, the addition of copper greatly reduces this tendency.

Thus typical aluminum alloys use silicon (typically one half percent to 1% atomic) or copper (typically one-half % atomic) or both as alloying agents. Efforts have been made to find other satisfactory aluminum alloy compositions; see e.g. Kikuta and Kikkawa, "Electromigration characteristics for Al—Ge—Cu," 143 J. Electrochem. Soc. 1088 (1996), which is hereby incorporated by reference.

Reduced Temperature Contact/Via Filling

The present application discloses a new metallization technology in which a melting-point depressant is locally introduced into the metal layer where it contacts the sidewalls of contact/via holes. This is preferably accomplished by a thin wetting layer which is only exposed on the sidewalls of contact/via holes. The wetting layer lowers the melting point and yield stress of the primary metallization layer at the points where this will most help the primary metallization layer to fill the contact/via hole. Since the concentration of the melting-point depressant is localized near contact/via holes, problems of precipitation or etch residues are minimized. This is particularly advantageous with aluminum metallization, but is also applicable to other metallization systems.

The advantages provided by the innovative structures and processes of the present invention include at least the following:

manufacturable;
no hardware modification needed;
effective in lowering the process temperature;
effective in preventing junction spiking;
little or no silicon/germanium precipitation;
ultra-thin protection layer can be formed; and
good extendibility to future generation of devices.

BRIEF DESCRIPTION OF THE DRAWING

The disclosed inventions will be described with reference to the accompanying drawings, which show important sample embodiments of the invention and which are incorporated in the specification hereof by reference, wherein:

FIGS. 2A, 2B, 2C1 and 2C2 show two different embodiments of an integrated circuit fabrication method.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

First Sample Embodiment

Figure 1:
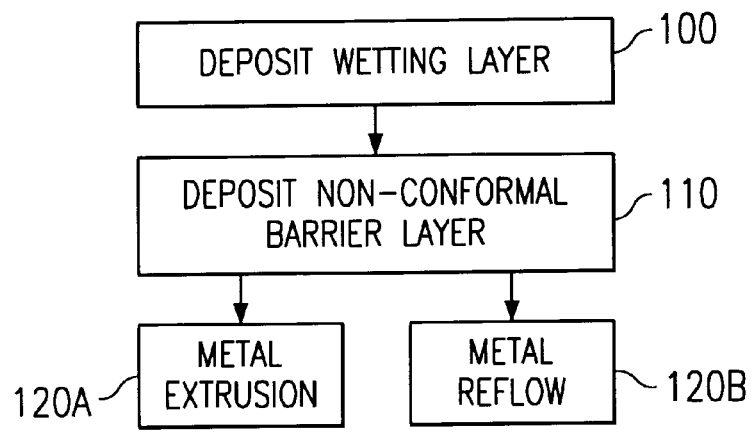
FIG. 1 shows a process flow for fabricating an integrated circuit structure which incorporates a liner.

FIG. 1 shows a process flow for fabricating an integrated circuit structure which incorporates a liner. This process will be explained in conjunction with the cross-sectional diagrams of FIGS. 2A–2C1.

As shown in FIG. 2A, a contact or via hole 202 has been etched through a dielectric layer 210 to expose an underlying layer 200. A deposition step is now performed (step 100) to coat the surface with a thin layer of the wetting agent 500. This thin layer 500 (in this example) is a silicon-rich titanium silicide layer (TiSi2.23), and is deposited by PVD. (Conformal deposition would be preferable, but is not strictly necessary.) This produces the structure shown in FIG. 2A.

Optionally, a thin diffusion barrier layer 510 is now deposited (step 110), preferably by a process yielding poor step coverage on the sidewall. (Layer 510 serves to prevent diffusion of the wetting agent 500 into the metal 520 in the field, that is, at locations away from the contact or via holes.) The barrier layer is preferably deposited by a non-conformal PVD method, which in the presently preferred embodiment is sputter deposition. This produces the structure of FIG. 2B. (If necessary a short isotropic etchback step can be used to assure that the wetting layer 500 is exposed on the sidewalls; but due to the additional process complexity entailed, this alternative is not preferred.) Depending on the deposition parameters, some of this diffusion barrier will typically be deposited on the bottom of the contact hole also.

For cavity filling with high pressure extrusion processes, a layer 520 of aluminum alloy is deposited (step 120A) at temperatures no greater than 400 degrees C. to close the mouth of the cavity. This produces the structure shown in FIG. 2C1. The aluminum alloy is then forced into the cavity by high pressure Ar or other gas (60–90 MPa), to produce the structure of FIG. 3.

Figure 3:
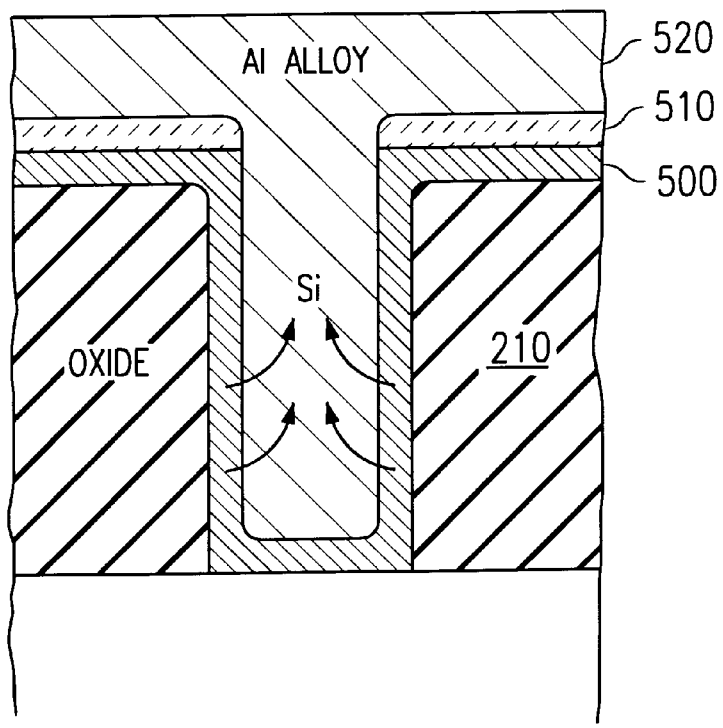
FIG. 3 shows diffusion gradients in a filled contact hole.

The excess silicon or germanium in the liner will diffuse into the aluminum alloy, lower the melting point of the aluminum alloy, and lower the yield stress, and increase the lateral diffusivity of aluminum. The lower aluminum melting point enables faster aluminum transport at lower temperatures, and thus a lower temperature is adequate for complete filling. The arrows in FIG. 3 show approximate diffusion gradients during this diffusion.

Preferably no vacuum break is allowed between deposition of a silicon or germanium containing wetting layer 500 and deposition of metallization 520, since a thin oxide layer will be formed on the surface of the wetting layer 500 and will interfere with the filling of the cavity 202 in the event the vacuum is broken and an oxidizing agent comes in contact with the elemental aluminum. However, if necessary a wet HF vapor clean or an $H_2$ plasma, or other plasma etch can be used to remove this oxide layer. In a successful experimental demonstration, complete filling of 0.35 micrometer contacts with an aspect ratio of 2.9 was obtained with a silicon-rich titanium silicide layer (TiSi2.23) as a liner. This layer was deposited by single target PVD to achieve a thickness of 50 nm on the field; with a 30% step coverage, this gives about 15 nm in the contacts. No barrier layer was used in this embodiment. A 700 nm layer of aluminum alloy (including one-half percent copper) was then deposited. The filling was performed with high pressure extrusion of aluminum alloy at a heater temperature of 450 degrees C. (wafer temperature of 370 degrees C.). No junction spiking was observed at the bottom of the contact.

Titanium silicide provides a convenient silicon source, and the titanium provides a slight additional melting point depression.

Sample Embodiment: Aluminum Reflow

In this class of embodiments, step 110 is followed by step 120B. In this step aluminum alloy is reflowed into the cavity 202 by one step sputtering at elevated temperatures (e.g. greater than or equal to 350 degrees C. but preferably less than 450 degrees C.) and low power (to allow time for the aluminum to diffuse into the contacts and vias). Alternatively a multistep sputtering operation can be used, first at low temperature (e.g. less than 100 degrees C.), then at high temperature (e.g. greater than 400 degrees C.). In either case the wetting layer introduces an addition of a melting-point depressant which will diffuse into the aluminum for a short distance to locally lower its melting point, and thus increase the diffusivity of aluminum along the surface. (The tendency of dopants to segregate to the surface is very advantageous in this regard.) Therefore, complete filling by aluminum reflow at lower temperatures can be obtained. FIG. 2C2 shows an intermediate step in this process, and FIG. 3 again shows the end result.

Sample Diffusion Barrier Embodiment

The diffusion barrier on the field will prevent diffusion of the wetting agent into aluminum, except at the hole sidewalls. Thus the aluminum in the field will have a low concentration of the wetting agent, and will provide a diffusion sink: the dissolved silicon/germanium concentration in the vias and contacts will be further dispersed into the aluminum in the field (away from the contact/via) during the following thermal processes. Therefore, less silicon or germanium precipitation in the cavity can be obtained. (The precipitation is undesirable since it will block the electron conduction and lower the electromigration lifetime). The preferred diffusion barrier is titanium nitride, which has the advantage that it will also be etched by the chloro-etch step which is used to pattern the aluminum metallization.

Alternative Diffusion Barrier Embodiment: SiNx

Note that titanium nitride is not the only possible diffusion layer which can be used to cap the wetting layer. Alternatively, a thin layer of silicon nitride (SiNx), instead of TiN, can be formed on the surface of the liner, by high density plasma nitridation. This nitride layer prevents the diffusion of silicon from the liner into the aluminum. High density plasma (HDP) nitridation with $N_2$ or $NH_3$ is advantageous due to the directionality of HDP plasma which will not nitridize the sidewall of liner.

Sample Wetting Agent Embodiment: Silicon

In this alternative embodiment the wetting agent is pure silicon. This is deposited, for example, by CVD from $SiH_4$-based precursor vapors at low temperatures (e.g. less than 400 degrees C.), to coat the surface with a conformal thin layer of silicon. Other conditions are as described above.

Sample Wetting Agent Embodiment: Germanium

In this alternative embodiment the wetting agent is germanium. Other conditions are as described above. This layer can be formed by PVD or CVD.

Sample Wetting Agent Embodiment: Silicon/Germanium

In this alternative embodiment the wetting agent is a mixture of silicon and germanium. Other conditions are as described above. This embodiment has the particular advantage that the concentration of silicon can be optimized to control spiking and precipitation, and the concentration of germanium can be used to further lower the melting point.

Alternate Embodiment: Barrier-Free Aluminum Contact

In this alternative class of embodiments, the wetting agent is a silicon source, and the aluminum alloy makes contact directly to silicon, without any diffusion barrier interposed. This has been experimentally demonstrated using an aluminum alloy which contained one-half percent copper (and essentially no silicon); good contact resistance was obtained, with no degradation of leakage currents.

Alternate Embodiment: Locally Diffused and Global Wetting Agent

In this further alternative class of embodiments, it is contemplated that the wetting agent has a uniform background concentration in the metal alloy, and also has a local concentration enhancement near the contact or via holes. This embodiment provides further latitude to fine-tune the concentration gradient of the wetting agent.

Alternate Embodiment: Depletion of Wetting Agent

In the presently preferred embodiment, the wetting agent (15 nm on sidewalls of a 350 nm contact) occupies about 15% of the contact volume. However, in alternative embodiments it is contemplated that the thickness of the wetting layer can be reduced to the point where it is consumed by the metallization layer. This option, while not presently preferred, provides another tool to fine-tune the concentration and concentration gradient of the wetting agent.

Alternate Embodiment: Aluminum with Locally Enhanced Copper Doping

Aluminum metallization often contains a half percent of copper, to improve electromigration resistance, and occasionally one percent copper alloys have also been used. The electrical properties would be further improved with higher concentrations of copper, but higher concentrations of copper are very difficult to etch (due to the low volatility of copper etch products). A concentration of 2–10% copper incorporated into the aluminum would be ideal for improving the conductivity and electromigration resistance of aluminum, if the etching problem can be solved. However, at very high copper concentrations aluminum and copper may precipitate an intermetallic compound which actually has a higher resistivity.

One attractive possibility for this process is with aluminum in a damascene process. In this process, an interlevel dielectric is patterned and etched to form slots where lines of metallization are desired, and also to form deeper holes where vias to an underlying conductive layer are desired. In this embodiment, copper provides an attractive wetting layer, since the process allows more copper to be incorporated into the trenches and vias than in to the other areas. A capping layer, preferably of TiAlN, WNx, or TiSiN, may then be used to reduce the concentration of the wetting agent in the aluminum in the field.

This class of embodiments uses copper in the wetting layer, with an aluminum damascene process. Removal of the copper in the field (away from the contact/via holes) is not a problem, since the CMP polishing in the damascene process accomplishes this. The disclosed invention is advantageous in this context too, since the local introduction of copper near the contact provides the best electromigration resistance at the locations of the highest current density.

Alternate Embodiment: Copper Metallization

The use of this innovative method with copper metallization is predicted to be an attractive alternative. Tin, aluminum, and silicon, for example, will lower the melting point of copper and allow it to flow at lower temperatures. Thus, in this embodiment, a wetting layer of a tin, aluminum or silicon containing layer is deposited, followed by deposition of a barrier layer, if desired, and copper. The barrier layer may be, for example, a tungsten nitride, or a aluminum- or silicon-alloyed titanium nitride. It is noted in this embodiment that a compound containing aluminum will form a native oxide which would prevent the wetting action of aluminum on copper. Thus, when such a compound is used as the wetting layer, the formation of an oxide should either be prevented, or the oxide removed, for example, with a fluorine etch.

According to a disclosed class of innovative embodiments, there is provided: an integrated circuit fabrication method for filling a high-aspect-ratio hole with a metal, comprising the steps of: (a.) providing a substrate which includes at least one substantially monolithic body of semiconductor material, said substrate having an interlevel dielectric layer thereon; (b.) patterning and etching said dielectric layer to produce openings therein; (c.) depositing a wetting layer over said dielectric layer and within said openings; and (d.) depositing said metal layer over said wetting layer and filling said openings with said metal.

According to another disclosed class of innovative embodiments, there is provided: An integrated circuit, comprising: a substrate having at least an interlevel dielectric layer thereon, said dielectric layer having openings therein; a liner being deposited over said dielectric layer and within said openings; a barrier layer overlying said liner only in locations where said openings are not present; and a metal layer predominantly comprising aluminum being deposited on said barrier layer and within said openings.

According to another disclosed class of innovative embodiments, there is provided: An integrated circuit, comprising: an interlevel dielectric having an opening therein which exposes monocrystalline silicon; and a patterned aluminum alloy layer which forms an ohmic contact to said silicon in said opening; said metallization layer having a graded concentration of silicon predominantly corresponding to diffusion from a distributed source on sidewalls of said opening.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

While the present invention has been demonstrated successfully with aluminum filling methods and predicted with copper, it is also possible, alternatively and less preferably, to adapt the disclosed methods to facilitate cavity filling using other metals, such as silver or gold. For such alternative embodiments, the wetting layer should include an additive which lowers the melting point of the metal, which has enough diffusivity in the metal to provide a sufficiently thick, softened layer to facilitate the cavity filling, but which does not have so great a diffusivity as to equalize the concentration throughout the metal. In the presently preferred embodiment, the diffusion length of the silicon additive is a few tens of nanometers under the process conditions used to fill the cavity with aluminum. This diffusion length is thus preferably in the range of 10 to 300 nanometers.

In alternative embodiments, this invention can also be adapted to cavity filling where part of the depth of the cavity is filled by a metal plug, or where the cavity filling is being done for the purpose of providing a metal plug.

What is claimed is:

1. An integrated circuit fabrication method for filling a high-aspect-ratio hole with a metallization layer, comprising the steps of:

(a.) depositing a wetting layer over a dielectric layer having contact/via openings therein, and within said openings;

(b.) forming a diffusion barrier layer on said wetting layer over horizontal portions of said dielectric layer, but not on said wetting layer at sidewalls of said openings; and (c.) depositing the metallization layer over said wetting layer and filling said openings with said metal;

wherein said wetting layer is a material which lowers the melting point of said metallization layer.

2. The method of claim 1, wherein said depositing and filling step is performed for a time which provides a diffusion length, of said wetting layer in said metal layer, which is in the range between 10 and 300 nanometers inclusive.

3. The method of claim 1, wherein said metallization layer predominantly comprises aluminum.

4. The method of claim 1, wherein said depositing and filling step comprises an extrusion step.

5. The method of claim 1, wherein said depositing and filling step comprises a metal reflow step.

6. An integrated circuit fabrication method for filling a high-aspect-ratio via with a metal or alloy, comprising the steps of:

providing a dielectric having a via therein;

depositing a flow temperature lowering layer of material capable of diffusing into said metal or alloy over said dielectric and within said via and along the sidewalls of said via to lower the melting temperature of said metal or alloy when combined with said metal or alloy;

disposing a layer of said metal or alloy over and in contact with said layer of material capable of diffusing into said metal or alloy, said layer of metal or alloy extending over said via;

heating the metal or alloy while the metal or alloy is disposed over and in contact with the layer of a material capable of diffusing into a metal or alloy to lower the flow temperature of the metal or alloy to a temperature below the normal flow temperature of said metal or alloy, said temperature being sufficiently high to cause said material capable of diffusing into said metal or alloy to combine with said metal or alloy to lower the flow temperature of said metal or alloy to a temperature at or below the flow temperature of the combined metal or alloy and material capable of diffusing into a metal or alloy to cause said metal or alloy to flow; and filling said via with said metal or alloy.

7. The method of claim 6, further comprising the step of forming a diffusion barrier layer on said layer of a material capable of diffusing into a metal or alloy over horizontal portions of said dielectric layer, but not on said layer of a material capable of diffusing into a metal or alloy at sidewalls of said via.

8. The method of claim 6, wherein said layer of a material capable of diffusing into a metal or alloy is silicon or germanium.

9. The method of claim 6, wherein said layer of metal or alloy predominantly comprises aluminum.

10. The method of claim 6, wherein said step of filling comprises an extrusion step.

11. The method of claim 6, wherein said step of filling comprises a metal reflow step.

12. The method of claim 6 wherein said step of filling comprises the step of filling said via with said metal or alloy by high pressure extrusion of said metal or alloy into said via while said metal or alloy is at its flow temperature.

* * * * *